United States Patent [19]

Berenz

[11] Patent Number: 4,908,325
[45] Date of Patent: Mar. 13, 1990

[54] METHOD OF MAKING HETEROJUNCTION TRANSISTORS WITH WIDE BAND-GAP STOP ETCH LAYER

[75] Inventor: John J. Berenz, Lawndale, Calif.
[73] Assignee: TRW Inc., Redondo Beach, Calif.
[21] Appl. No.: 270,383
[22] Filed: Nov. 9, 1988

Related U.S. Application Data

[63] Continuation of Ser. No. 774,499, Sep. 15, 1985, abandoned.

[51] Int. Cl.$^4$ .......................................... H01L 21/265
[52] U.S. Cl. ........................... 437/40; 148/DIG. 139; 156/649; 156/662; 357/22; 357/23.15; 437/38; 437/39; 437/133; 437/176; 437/203
[58] Field of Search .................. 148/DIG. 56, 56, 65, 148/72, 99, 110, 135, 141, 139, 140; 156/610-614, 656, 657, 662, 654, 655, 649, 658; 357/4, 15, 16, 22, 23.15; 437/38, 39, 40, 65, 66, 81, 126, 133, 175, 176, 203, 912

[56] References Cited

U.S. PATENT DOCUMENTS

| | | | |
|---|---|---|---|
| 3,959,045 | 5/1976 | Antypas | 156/3 |
| 4,255,755 | 3/1981 | Itoh et al. | 357/18 |
| 4,575,924 | 3/1986 | Reed et al. | 29/576 E |

FOREIGN PATENT DOCUMENTS

| | | | |
|---|---|---|---|
| 0028366 | 2/1982 | Japan | 357/22 |
| 0031072 | 2/1984 | Japan | 357/22 |

OTHER PUBLICATIONS

"High Electron Mobility Transistors for LSI Circuits" by T. Mimura, K. Nishiuchi, M. Abe, A. Shibatomi and M. Kobayashi in *Proceedings of the International Electron Device Meeting*, Dec., 1983, paper 5.1, pp. 99–102.
"Microwave Power GaAs MISFET's With Undoped AlGaAs As An Insulator", by B. Kim, H. Q. Tserng and H. D. Shih in *IEEE Electron Device Letters*, Vol. EDL-5, No. 11, Nov., 1984, pp. 494–495.
"A New Structure GaAs MESFET With A Selectively Recessed Gate", by Issey Ohta, Tatsuo Otsuki, Masaru Kazumura, Gota Kano, and Iwao Teramoto in *IEEE Transactions on Electron Devices*, Vol. ED-31, No. 3, March, 1984, pp. 389–390.
R. Fischer et al., "New High-Speed (AlGa)As . . . .", IEEE Circuits and Dev. Mag., July, 1985, Vol. 85, pp. 35–38.
S. Ghandhi, "VLSI Fabrication Principles", John Wiley & Sons, New York, N.Y. 1983, pp. 281–283.
Hiyamizu et al., "MBE-Grown GaAs/N-AlGaAs . . . ", Jap. J. App. Phys., Vol. 21, Supp. 21-1, pp. 161–168, 1981.
Thorne et al., "Performance of Inverted Structure Modulation", Jap. J. App. Phys., Vol. 21, No. 4, April, 1982, pp. 1223–1224.
H. Lee et al., "High Temperature Annealing of Modulation . . . ", IEEE Elect. Dev. Soc., Vol. 83, Aug. 15, 1983, pp. 204–208.
A. Piotrowska et al., "Ohmic Contacts to III–V . . . ", Solid-State Electr., Vol. 26, No. 3, pp. 179–197, 1983.
M. Laviron, "How Noise . . . . Two-Dimensional Electron Gas . . . . ", Appl. Phys. Lett. 40(6), March 15, 1982, pp. 530–532.
T. Mimura, "High Electron Mobility Transistor", Jpn. J. Appl. Phys. Vol. 20, No. 8, Aug., 1981, pp. L598–L600.
T. Mimura, "A New Field-Effect Transistor with Selectively Doped GaAs/n-AlGa$_{1-x}$As . . . .", Jpn. J. Appl. Phys. 19(5), May, 1980, pp. 225–227.
L. C. Witkowski, "High Mobilities in Al$_x$Ga$_{1-x}$As-GaAs . . . . ", Appl. Phys. Lett. 37(11), Dec. 1, 1980, pp. 1033–1035.

*Primary Examiner*—Brian E. Hearn
*Assistant Examiner*—William Bunch
*Attorney, Agent, or Firm*—James M. Steinberger; Ronald L. Taylor

[57] ABSTRACT

The thickness of a selected layer in an epitaxial heterojunction transistor is initially set to the exact desired value upon its formation, preferably by molecular beam epitaxy, and its thickness is left virtually unaltered during the rest of the fabrication process. Means are provided to prevent alteration of this thickness during subsequent exposure of the selected layer.

16 Claims, 6 Drawing Sheets

METHOD OF MAKING HETEROJUNCTION TRANSISTORS WITH WIDE BAND-GAP STOP ETCH LAYER

This application is a continuation of application Ser. No. 06/774,499, filed 9/10/85, now abandoned.

BACKGROUND OF THE INVENTION

The present invention pertains to High Electron Mobility Transistors and to Heterojunction Bipolar Transistors.

High Electron Mobility Transistor:

A High Electron Mobility Transistor (HEMT) is a Metal Semiconductor Field Effect Transistor (MESFET) fabricated on a doped aluminum gallium arsenide/undoped gallium arsenide heterostructure. This heterostructure is preferably formed by molecular beam epitaxy.

When, for example, a silicon-doped aluminum gallium arsenide (AlGaAs) layer is grown on top of an undoped gallium arsenide (GaAs) layer, a heterojunction is formed between the two layers. A two-dimensional electron gas is formed on the GaAs side of the heterojunction due to the unique crystal structure of the heterojunction and the greater electron affinity of the GaAs. The AlGaAs layer is fully depleted of mobile charge near the heterojunction and acts like the gate oxide of a metal oxide semiconductor field effect transistor. When a Schottky barrier gate is deposited on the AlGaAs layer, a depletion region is formed beneath the gate. The resulting device functions as a field effect transistor in that the Schottky barrier gate controls the number of electrons in the two-dimensional electron gas formed on the GaAs side of the heterojunction.

Carrier transport in the electron gas is similar to transport in undoped GaAs where the electron mobility is many times greater than doped GaAs because there is little or no impurity scattering. As a result, the electrons travel at twice the saturated velocity of a conventional GaAs MESFET. Thus, ultra high speed digital integrated circuits can be fabricated with HEMT devices. For example, HEMT ring oscillators have been fabricated which exhibit 12 picosecond switching delays at room temperature.

For all their promise, a substantial problem exists in fabricating HEMT devices. The thickness of the doped AlGaAs layer beneath the gate is difficult to control, and yet it is critical to device performance. Specifically, for each variation by 10 angstroms in the thickness of the AlGaAs layer, the saturated source-drain current of the HEMT is changed by 1 milliampere. Present fabrication techniques first form the AlGaAs layer and then alter its thickness during subsequent etching steps. Unfortunately, such techniques cannot produce layers having the uniformity and reproducibility required for large scale production of these devices. Thus, there exists a great need to improve the control over the thickness of the AlGaAs layer in a HEMT.

Heterojunction Bipolar Transistor:

A Heterojunction Bipolar Transistor typically comprises an epitaxial structure of various layers including gallium arsenide and aluminum gallium arsenide. For example, an NPN heterojunction bipolar transistor comprises an n-type GaAs collector layer, a thin p-doped GaAs base layer and an n-type AlGaAs emitter layer.

One problem with bipolar transistors, including GaAs heterojunction bipolar transistors, is that the cut-off frequency and power dissipation are adversely affected by any increase in base resistance. Typically, the extreme thinness of the base layer, which is required for low-power and high-frequency operation, gives rise to current crowding in the base-emitter heterojunction, which increases the base resistance. This problem is worsened during etching to expose the base layer to form the base contact. This is because such etching attacks the base layer and can alter its cross-sectional shape.

Another problem is that, during operation, the majority carrier current from emitter to base is accompanied by a reverse current arising from injection of minority carriers from base to emitter.

Thus, in heterojunction bipolar transistors, there exists a need to form semiconductor layers, such as the base layer, and to expose it without affecting its thickness or shape. Further, there exists the need to prevent minority carrier injection from base to emitter during transistor operation.

SUMMARY OF THE INVENTION

In this invention, the thickness of a selected layer in an epitaxial heterojunction transistor is initially set to the exact desired value upon its formation, preferably by molecular beam epitaxy, and its thickness is left virtually unaltered during the rest of the fabrication process. Means are provided to prevent alteration of this thickness during subsequent exposure of the selected layer.

High Electron Mobility Transistor:

In the HEMT of the present invention, the final thickness of the critical aluminum gallium arsenide layer, discussed previously, is accurately determined upon its formation, preferably by molecular beam epitaxy and thereafter is unaltered during the rest of the fabrication process. Use of an aluminum arsenide (AlAs) stop etch layer permits exposure of the AlGaAs layer by subsequent etching steps without altering its thickness.

In particular, an AlAs stop etch layer is grown over the critical AlGaAs layer. Thereafter, a GaAs cap layer is grown thereover. A portion of the cap layer must be etched away in order to expose the critical AlGaAs layer for electrical contact thereto. In order to stop the etching through the GaAs cap layer before it reaches the critical AlGaAs layer, only a very thin AlAs stop etch layer is required, on the order of fifty angstroms. The AlAs layer is removed before depositing a gate electrode on the AlGaAs layer.

In another embodiment of the invention, a metal insulator semiconductor high electron mobility transistor (MIS-HEMT) device is formed using virtually the same process. In this embodiment, however, the AlAs layer is not removed and the gate electrode is deposited directly on top of the thin AlAs layer. In the MIS-HEMT of this alternative embodiment, the AlAs layer, in addition to being a stop etch layer, acts as a wide band-gap gate insulator, giving the device an ability to accept a higher gate voltage, resulting in proportionately higher source-drain current, a significant advantage.

Heterojunction Bipolar Transistor:

In the heterojunction bipolar transistor of the present invention, the problems discussed previously, concerning the minority carrier injection from base to emitter and the base-emitter resistance, are solved. First, the thickness and shape of the selected critical layer (such as the GaAs base layer) is established and precisely set upon its epitaxial formation, preferably by molecular beam epitaxy. Then, an aluminum arsenide (AlAs) layer is formed over the selected layer and serves as a stop etch layer. It may also serve to function as a wide bandgap semiconductor layer. Specifically, if the AlAs layer is formed over the base layer, then the AlAs layer not only acts as a stop etch layer protecting the underlying base layer, but also functions during transistor operation as a wide band-gap emitter.

During exposure of the base layer by etching of the base contact, the AlAs layer acts as a stop etch layer to protect the base from etchants which would otherwise attack it, thus preventing any increase in base resistance due to deliterious effects of the etchants on the base layer. As an emitter, the AlAs layer has a much wider band-gap than the GaAs base, and thus minimizes or virtually stops the undesirable base-emitter minority carrier reverse current.

DESCRIPTION OF THE DRAWINGS

The invention may be understood by reference to the accompanying drawings of which:

FIGS. 4b and 4c are graphs of the AlAs mole fraction and doping profiles, respectively, as a function of depth, corresponding to the structure of FIG. 4a;

FIGS. 5b and 5c are graphs of the AlAs mole fraction and doping profiles, respectively, as a function of depth corresponding to the structure of FIG. 5a.

DETAILED DESCRIPTION

Background

Figure 1:
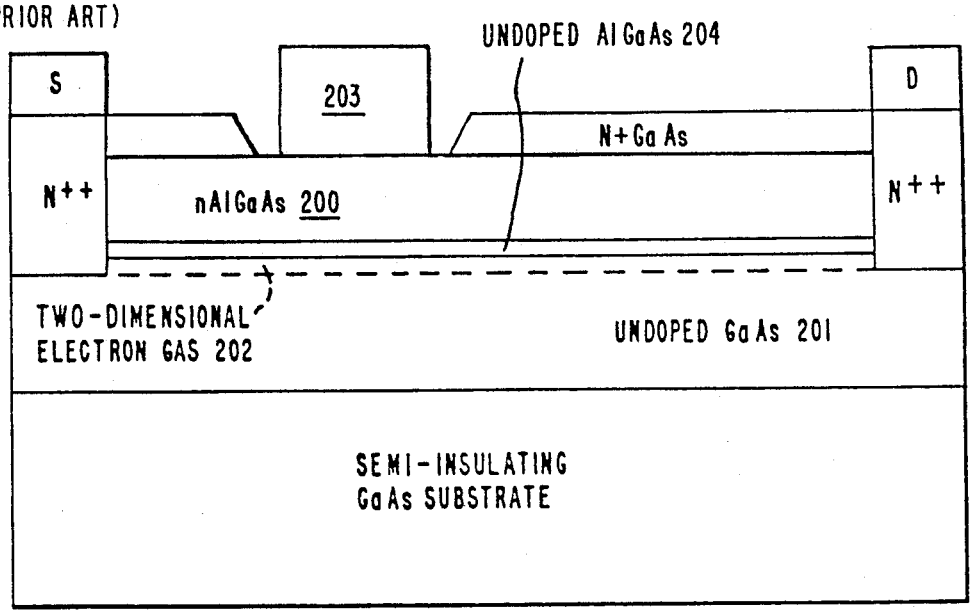
FIG. 1 is a simplified cross-sectional view of a typical depletion mode HEMT device of the prior art.

The depletion mode high electron mobility transistor (HEMT) illustrated in FIG. 1 is a MESFET fabricated on a doped-AlGaAs/undoped GaAs heterostructure, which heterostructure is grown preferably by molecular beam epitaxy. As will be described below, the HEMT of FIG. 1, unlike a conventional GaAs MESFET, functions something like a metal oxide semiconductor field effect transistor in that the gate 203 controls the number of electrons in the two-dimensional electron gas 202 by raising and lowering the energy barrier at the heterojunction.

In FIG. 1, when a silicon-doped 350 angstrom thick AlGaAs layer 200 is grown on top of an undoped GaAs layer 201, a heterojunction is formed therebetween. A two-dimensional gas 202 is also formed on the GaAs side of the heterojunction due to the unique crystal structure of the heterojunction and due to the greater electron affinity of the GaAs layer 201. When a Schottky barrier gate electrode 203 is deposited on the AlGaAs layer 200, a depletion region is formed in the AlGaAs layer 200 beneath the electrode 203. Therefore, the AlGaAs layer 200 is fully depleted of mobile charge near the heterojunction directly beneath the gate and acts like a gate insulator layer in a metal oxide semiconductor field effect transistor.

If the AlGaAs layer 200 is sufficiently thick, the depletion region does not extend to the heterojunction between the two layers 201 and 200, so that the device will be normally on. In this mode of operation, the device is usually referred to as a depletion mode device. In this depletion mode device, applying a negative voltage to the gate 203 extends the gate depletion region through the heterojunction into the GaAs layer 201, thus interdicting the two-dimensional electron gas 202 and pinching off the source-drain current therethrough.

Figure 2:
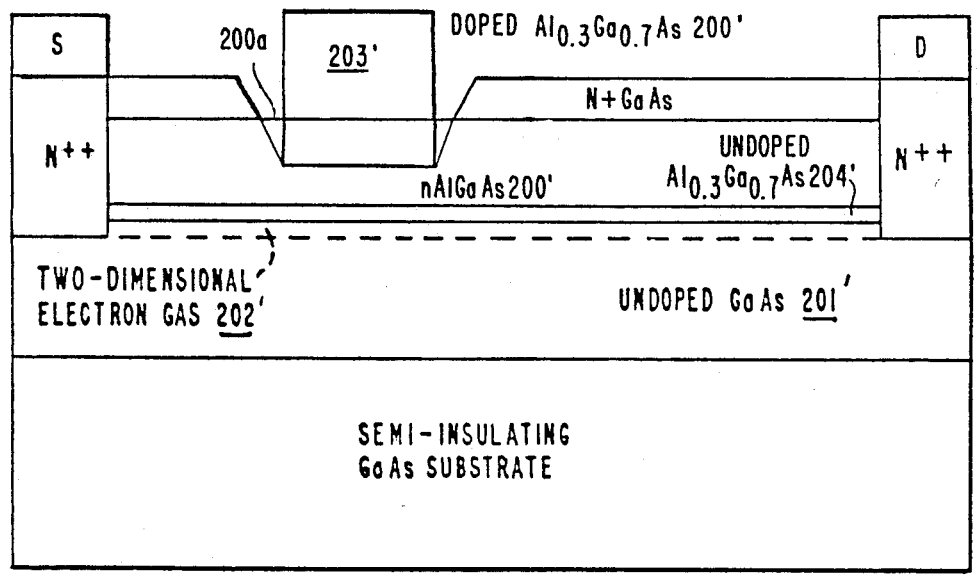
FIG. 2 is a simplified cross-sectional view of an enhancement mode HEMT device of the prior art.

In the enhancement mode HEMT illustrated in FIG. 2, the thickness of the AlGaAs layer 200' beneath the gate 203' is reduced to about 250 angstroms so that the gate depletion region extends through the heterojunction into the undoped GaAs layer 201 when no voltage is applied to the gate. Specifically, the gate 203' is recessed into the AlGaAs layer 200. This may be done for example by etching the AlGaAs layer 200' to form a recess 200a.

Whenever a sufficiently large positive voltage is applied to the gate 203' of the enhancement mode HEMT of FIG. 2, the energy barrier beneath the gate 203' is reduced, allowing the two-dimensional electron gas 202' to extend completely beneath the gate 203, thus turning on the device.

The primary advantage of the HEMT of FIGS. 1 and 2 is that there is little or no impurity scattering in the undoped GaAs in which the two-dimensional electron gas 202 resides. As a result, the electrons travel at twice the saturated velocity of a conventional GaAs MESFET, $2 \times 10^7$ centimeters per second at room temperature, and exhibit an electron mobility of nearly 8,000 $cm^2$/volt seconds, which is twice the mobility exhibited in the source to drain channel of a conventional doped GaAs FET.

Typical enhancement mode and depletion mode HEMTs are disclosed in an article entitled "High Electron Mobility Transistors for LSI Circuits" by Mimura et al, *Proceedings of the International Electron Device Meeting*, December, 1983, paper 5.1, pages 99 thru 102. In the prior art, the thickness of each layer of the HEMT was generally determined by etching.

The electrical characteristics of the HEMT are very sensitive to the thickness of the material beneath the gate, such as the doped aluminum gallium arsenide layer 200 of FIG. 1. For example, the sensitivity of the saturated source-drain current of an HEMT is one milliampere per 10 angstroms thickness of the AlGaAs layer 200 beneath the gate 203. For a saturated source-drain current on the order of 5 milliamperes, each additional AlGaAs atomic monolayer (about 10 angstroms) in the layer 200 represents a 20% change in the saturated source-drain current of the HEMT. In fabricating monolithic circuits, uniformity of transistor characteristics must be maintained over large areas to obtain functional circuits. Uniformity is also important in obtaining high yields for discrete devices. From this, it can be seen that the thickness of the AlGaAs layer 200 is extremely critical.

The Invention

Etching processes heretofore used in the prior art cannot accurately control the thickness of epitaxial layers, such as the critical aluminum gallium arsenide layer 200 of FIG. 1. Such processes depend on selective etching of GaAs with respect to AlGaAs to control the AlGaAs thickness. It is a discovery of this invention that the difference between the dry etching rate for GaAs and the rate for AlGaAs with $CCl_2 F_2$+He gas etchants is not adequate to control the AlGaAs layer thickness to be within the small tolerances required for uniform production of HEMTs.

In the present invention, etching is not used to control the thickness of the critical AlGaAs layer. Instead, the thickness of this layer is very precisely determined at the time of its epitaxial growth, preferably by molecular beam epitaxy. Furthermore, in this invention, means are provided to actually prevent subsequent etching steps from changing the AlGaAs layer thickness while permitting it to be exposed to form electrical contact thereto. The means for protecting the AlGaAs layer comprises, for example, an aluminum arsenide (AlAs) stop etch layer deposited over the AlGaAs layer.

Novel High Electron Mobility Transistor and Process

Figure 3A:
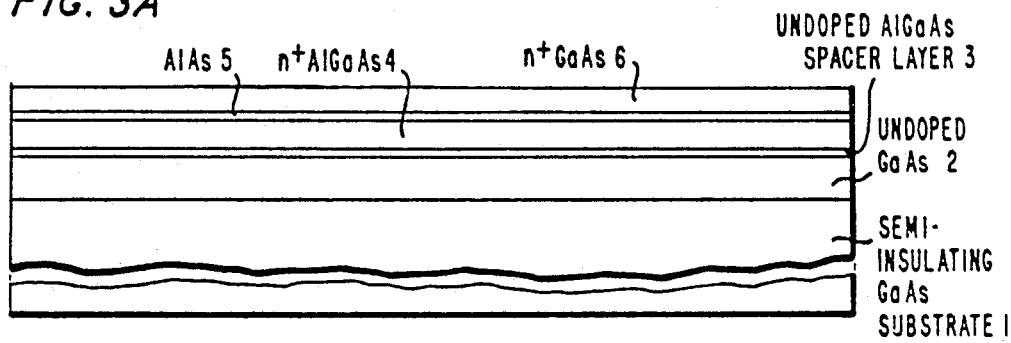
FIGS. 3a thru 3d are simplified cross-sectional views of a novel HEMT shown sequentially during its fabrication in accordance with the method of the present invention.

In this invention, the epitaxial structure of FIG. 3a is first formed, preferably by molecular beam epitaxy, on the crystal 100 plane of a semi-insulating GaAs substrate layer 1. Illustratively, the substrate layer 1 may be grown by the liquid encapsulated Czochralski process. Layer 2 is an approximately 8,000 angstrom-thick undoped GaAs layer and layer 3 is an approximately 20 angstrom thick undoped AlGaAs layer. The interface between the GaAs layer 2 and the undoped AlGaAs layer 3 forms the heterojunction beneath which the two-dimensional electron gas resides. The undoped AlGaAs layer 3 is a buffer layer, over which is grown an n-doped AlGaAs layer 4. The AlGaAs layer 4 is doped with silicon and is approximately 350 angstroms thick and comprises three parts of aluminum for every seven parts of gallium and ten parts of arsenic. The thickness of each of the AlGaAs layers 3 and 4 is critical (as discussed previously) and is very accurately determined and controlled at the time of their formation. The preferred method of formation of both AlGaAs layers 3 and 4 is molecular beam epitaxy. Layer 5 is the stop etch layer discussed above and is an approximately 50 angstrom-thick undoped AlAs layer comprising 50% aluminum and is grown directly over the doped AlGaAs layer 4. Layer 6 is an approximately 500 angstrom thick undoped GaAs or other suitable material.

Figure 3B:
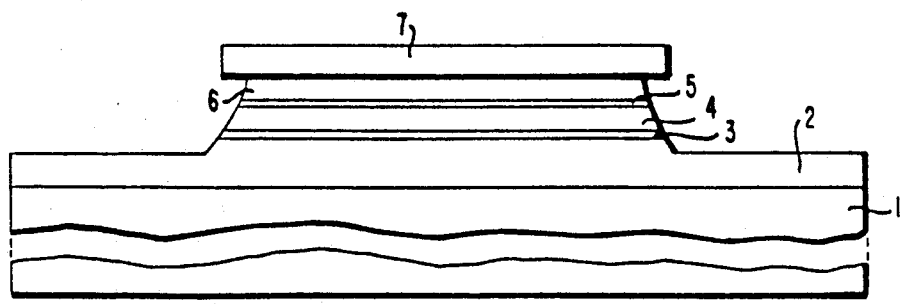
Figure 3C:
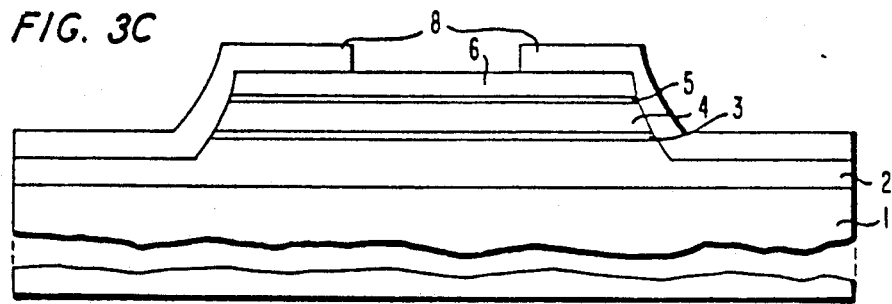
Figure 3D:
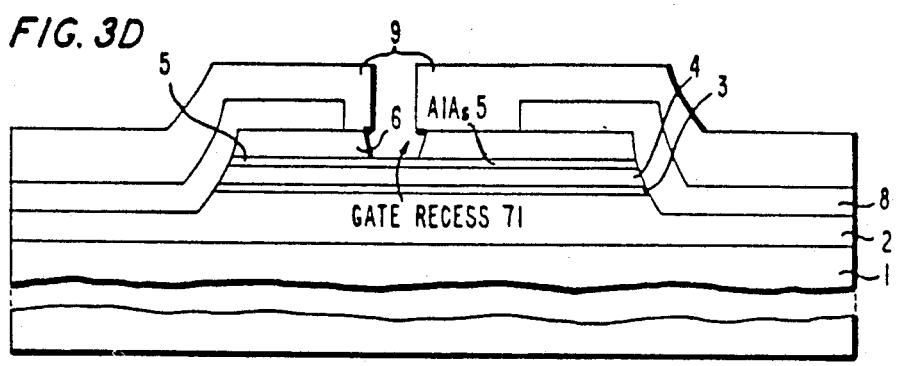

As shown in FIG. 3b, a photoresist layer 7 is used to photolithographically mask active device areas for etching with, for example, a 3:1:1 solution of $H_2O$:HF:-$H_2O_2$. In step 3, shown in FIG. 3c, ohmic metal layers 8 are deposited, photolithographically defined and alloyed in a manner well known in the art to form source and drain ohmic contacts on the undoped GaAs layer 6. The ohmic metal layers 8 comprise nickel, gold germanium (12% germanium by weight) and another layer of nickel and a top layer of gold. In step 4, shown in FIG. 3d, a photoresist layer 9 is applied to the structure of FIG. 3c. Then a gate recess 71 is etched through the GaAs layer 6 using a chemical etchant comprising $H_2O_2$ and $NH_4OH$ having a PH of 7. This etchant selectively removes any GaAs and AlGaAs having an aluminum mole fraction of at least 0.3 (15% aluminum). However, this etchant does not etch the AlAs stop etch layer 5, a significant feature.

The critical thickness dimension of the underlying AlGaAs layers 3 and 4, previously determined accurately during their formation by molecular beam epitaxy (for example), remains unaffected during the etching process. The device characteristics which are controlled by the thickness of the AlGaAs layers 3 and 4 are thus firmly established with the accuracy of the molecular beam epitaxy process and left unchanged, a significant advantage. Since the uniformity of thickness of layers grown by molecular beam epitaxy is on the order of 3% across a 4 inch square area, the device characteristics of HEMTs on a two inch semiconductor wafer produced by this process are virtually uniform.

Figure 3E:
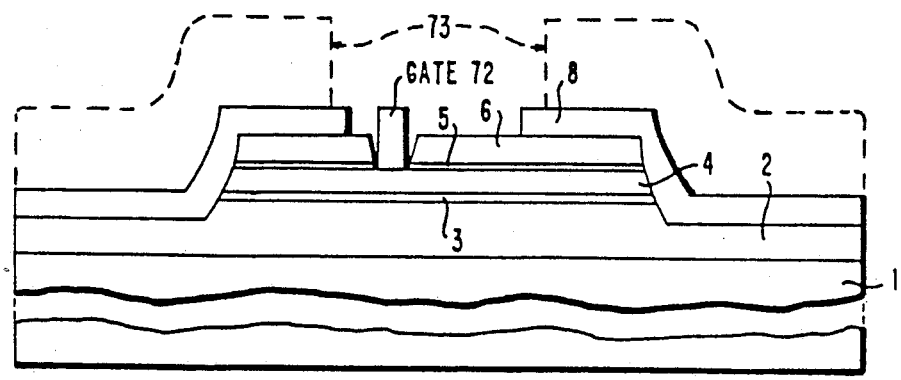
FIG. 3e illustrates the novel HEMT of the present invention resulting from the process illustrated in FIGS. 3a thru 3d.

In step 5, shown in FIG. 3e, the AlAs stop etch layer 5 is removed using a buffered oxide etch comprising HF buffered with $NH_4F$, which does not attack the AlGaAs layer 4. A gate electrode 72 is formed by depositing an approximately 100 angstrom thick layer of titanium and an approximately 3,000 angstrom-thick layer of aluminum and photolithographically defining that layer in a manner well known in the art to form the gate 72 illustrated in FIG. 3e. Finally, an overlay metal layer 73 comprising Ti/Pt/Au, illustrated in dashed line in FIG. 3e, is deposited as illustrated to reduce metal sheet resistance of the source and drain contacts. Then the substrate 1 is thinned, for example, by polishing with Br and methanol, and is metallized if necessary.

NOVEL METAL INSULATOR SEMICONDUCTOR—HIGH ELECTRON MOBILITY TRANSISTOR

In an alternative embodiment of this invention, a metal insulator semiconductor - high electron mobility transistor (MIS-HEMT) may be produced with significant improvement over prior art MIS-HEMTs. A prior art MIS-HEMT is disclosed in Hotta et al., "A New AlGaAs/GaAs Heterojunction FET with Insulated Gate Structure (MISSFET)", *Japanese Journal of Applied Physics*, Vol. 21, No. 2, February 1982, pgs. L. 122 thru L. 124. The disadvantage of the MIS-HEMT disclosed in the Hotta et al. publication is the proliferation of surface states in the interface between its $Al_2O_3$ insulator layer and the AlGaAs layer.

Figure 3F:
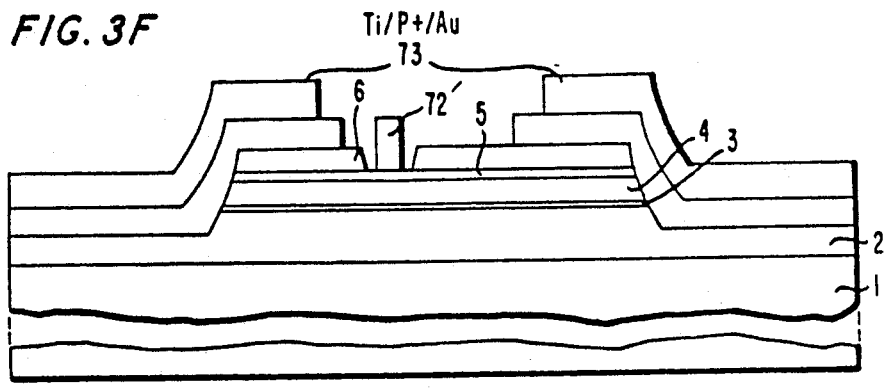
FIG. 3f is a simplified cross-sectional view of a novel MIS-HEMT of the present invention fabricated in accordance with the invention.

In the present invention, a novel MIS-HEMT is formed by employing the process described previously in connection with FIGS. 3a thru 3d. After formation of the gate recess 71 illustrated in FIG. 3d, the aluminum arsenide layer 5 is not removed, but is rather left in place in the gate recess 71. Thereafter, as illustrated in FIG. 3f, a gate electrode 72' is formed directly over the aluminum arsenide layer 5. The aluminum arsenide layer 5 thus serves not only as a stop etch layer, but also as a wide band-gap gate insulator layer in the device of FIG. 3f. Thus, the device of FIG. 3f is an MIS-HEMT and enjoys a number of advantages, some attributable to the fact that the aluminum arsenide layer 5 has a higher conduction band-valence band energy gap, or "bandgap", (2.1 electron volts) than the aluminum gallium arsenide layer 4 (1.8 electron volts).

The MIS-HEMT of FIG. 3f exhibits a higher gate turn on voltage (about 2 volts) than the HEMT of FIG. 3e. It also exhibits a higher gate-drain breakdown voltage (20 volts), permitting a higher DC bias voltage to be applied to the gate. Because the useful gate voltage swing is limited by the turn-on voltage in the forward bias direction, and the gate-drain breakdown voltage in the reverse bias direction, a much larger AC voltage swing is accommodated by the MIS-HEMT of FIG. 3f. The result is that the channel carrier concentration is proportionately higher, generating proportionately higher source-drain current and output power, a significant advantage over the HEMT of FIG. 3e. Another advantage of the MIS-HEMT of FIG. 3f is that its source-gate capacitance is less than that of the HEMT of FIG. 3e, due to the presence of the wide band-gap insulator AlAs layer 5. The result is that the MIS-HEMT of FIG. 3f exhibits a higher cutoff frequency.

The MIS-HEMT of FIG. 3f also enjoys significant advantages over the MIS-HEMT of the prior art as exemplified by the Hotta et al. publication. For example, the interface between the AlAs layer 5 and the AlGaAs layer 4 has very few surface states compared to the relatively large number of surface states existing between the $Al_2O_3$/AlGaAs interface in the MIS-HEMT of the Hotta et al. reference. This is believed to be due to the fact that the AlAs layer forms a higher quality epitaxial crystal interface with AlGaAs than does an $Al_2O_3$ layer. Accordingly, the MIS-HEMT of FIG. 3f exhibits less surface state noise than the MIS-HEMT of the prior art as exemplified by the Hotta et al. publication. Because AlAs has such a wide energy band-gap, the preferred thickness of the AlAs insulator layer 5 in the MIS-HEMT of FIG. 3f is about 60 angstroms, in contrast to the 100 angstrom thickness of the corresponding $Al_2O_3$ insulator layer of the MIS-HEMT of the Hotta et al. reference.

HETEROJUNCTION BIPOLAR TRANSISTOR

Other embodiments of the invention are useful in the fabrication of GaAs/GaAlAs heterojunction bipolar transistors. In a first illustration of the fabrication of heterojunction bipolar transistors, one embodiment of the invention provides a very wide band-gap emitter while enabling precise control of the critical base thickness and protection of the base layer from etchants during exposure of the base layer to form electrical contact thereto. Provision of a novel wide band-gap emitter results in significant improvement in device performance which will be described below.

One problem with bipolar transistors, including gallium arsenide heterojunction bipolar transistors, is that the cutoff frequency and power dissipation are adversely affected by any increase in base resistance. Typically, the extreme thinness of the base layer, which is required for low power high frequency operation, gives rise to current crowding in the base-emitter junction, which increases the base resistance. In the prior art, this problem is worsened during etching to expose and contact the base layer. This is because such etching attacks the base layer and can alter or distort its otherwise uniform cross-sectional shape. The result is greater current crowding and higher base resistance, a significant problem.

Another problem is that, during operation, the majority carrier current from emitter to base is accompanied by a reverse current arising from the injection of minority carriers from base to emitter.

Both of these problems are solved in the present invention. First, the thickness and shape of the base layer is very precisely determined during its epitaxial formation. The most uniform results are obtained using molecular beam epitaxy. Thereafter, an AlAs layer is grown over the base and serves two purposes. First, during subsequent exposure of the base layer to form electrical contact thereto, the AlAs layer acts as a stop etch layer over the base to protect the base from etchants which would otherwise attack it and raise the base resistance. Secondly, during transistor operation, the AlAs layer serves as a very wide band-gap emitter layer. Because the AlAs has a wider band-gap than the GaAs base, the AlAs layer virtually stops the undesirable base-emitter minority carrier "reverse current".

Thus, the invention solves the problem of base-emitter minority carrier injection while at the same time reducing base resistance to maintain a high cutoff frequency and a low power dissipation.

Figure 4A:
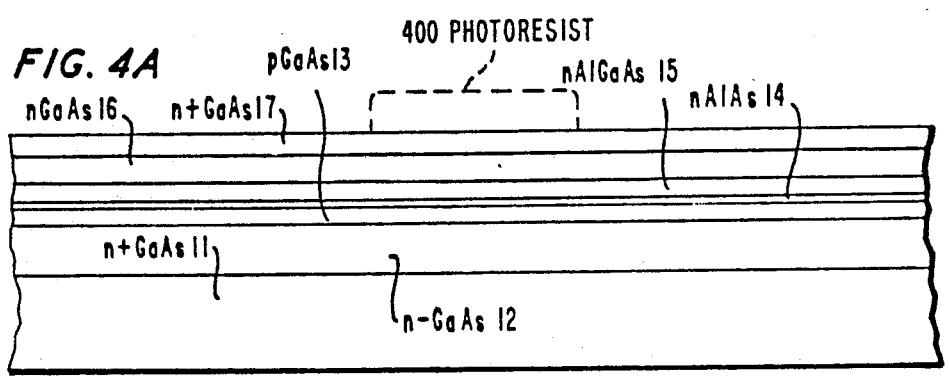
FIG. 4a is a cross-sectional view of an epitaxial structure formed in accordance with the process of the present invention for fabricating a novel heterojunction bipolar transistor.
Figure 4B:
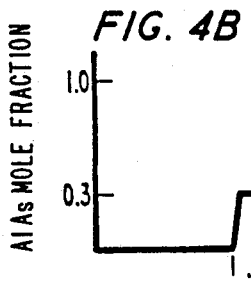
Figure 4C:
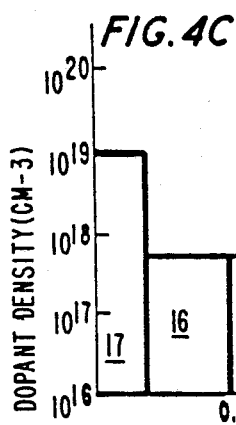

Specifically, as shown on FIG. 4a, an epitaxial structure is formed, preferably by molecular beam epitaxy. The structure of FIG. 4a comprises an n-type conductivity gallium arsenide layer or substrate 11 of crystal orientation 100, an n-type conductivity gallium arsenide collector layer 12, a p-type conductivity gallium arsenide base layer 13, an n-type conductivity aluminum arsenide emitter layer 14, an n-type conductivity aluminum gallium arsenide layer 15, an n-type gallium arsenide layer 16 and an n-type gallium arsenide cap layer 17. FIG. 4b is a graph of the mole fraction of aluminum arsenide as a function of depth through the layers shown in FIG. 4a. FIG. 4c is a graph corresponding to FIG. 4b of the doping density as a function of depth through the layers illustrated in FIG. 4a.

In the next step of the process, the lateral width of the emitter layer 14 is defined by forming a photoresist mask 400 shown in dashed line in FIG. 4a. Then, an etchant, which is reactive with layers 15, 16 and 17 but not with the aluminum arsenide emitter layer 14, is applied to the structure of FIG. 4a. An example of such an etchant is a solution of $H_2O_2$ and $NH_4OH$ with a PH of 7. This etchant exposes but does not etch the AlAs layer 14. The AlAs layer 14 thus functions as a stop etch layer, in addition to performing as an emitter layer later during transistor operation. A second etchant is applied which etches a portion of the AlAs layer 14 to expose the GaAs base layer 13 but does not etch the GaAs base layer 13. An example of the second etchant is the buffered oxide etch previously discussed in this application. The thickness and shape of the base layer 13, previously defined accurately during its formation by molecular beam epitaxy is thus unaffected during etching to permit electrical contact thereto. The resulting structure is illustrated in FIG. 4d in solid line.

Figure 4D:
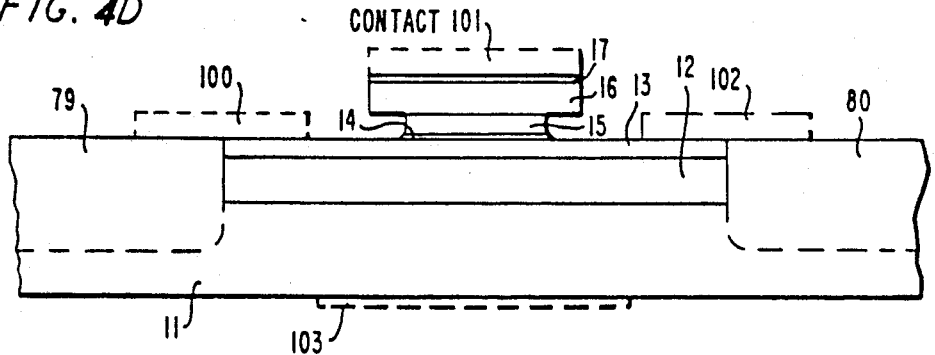
FIG. 4d is a cross-sectional view of a novel heterojunction bipolar transistor formed from the structure of FIG. 4a in accordance with the method of the present invention.

Methods well known in the art are used to complete the fabrication by forming isolation regions 79 and 80 by ion implantation damage and forming ohmic contacts 100, 102 to the base layer 13, forming ohmic contact 101 over the emitter layer 14 and forming ohmic contact 103 on the substrate backside under the collector 12, as illustrated in FIG. 4d in dashed line.

Figure 5A:
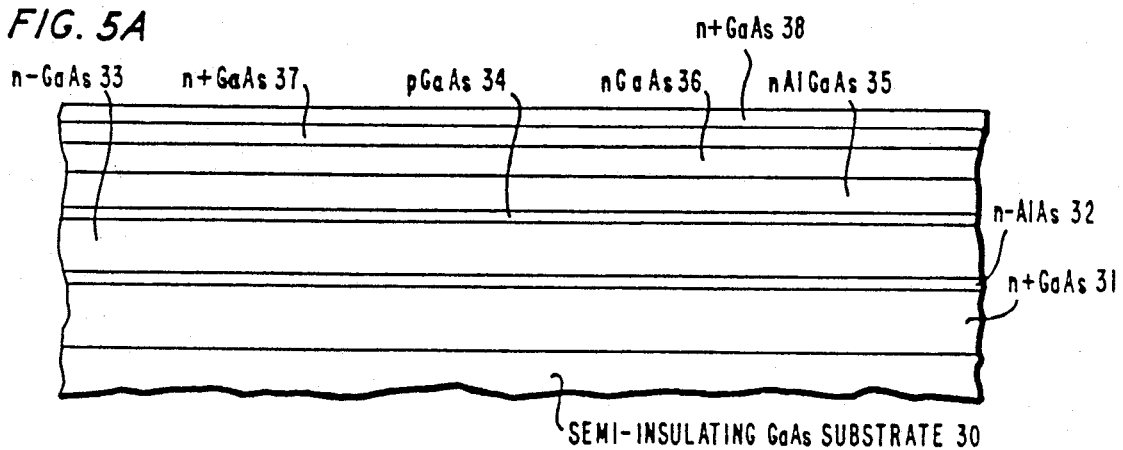
FIG. 5a is a cross-sectional view of another epitaxial structure formed in accordance with the method of the present invention for fabricating a novel heterojunction bipolar transistor.

In another aspect of the invention, a collector layer in a heterojunction bipolar transistor is protected from etchants during exposure of the collector layer for forming electrical contact thereto. First, as illustrated in FIG. 5a, an epitaxial structure is formed on a semi-insulating GaAs substrate 30, preferably by molecular beam epitaxy. This structure comprises an n-type GaAs collector contact layer 31, an n-type AlAs stop etch layer 32, an n-type GaAs collector layer 33, a p-type GaAs base layer 34, an n-type AlGaAs emitter layer 35, an n-type GaAs layer 36 and an n-type GaAs layer 37. In addition, an n-type GaAs layer 38 is grown over the GaAs layer 37.

Figure 5B:
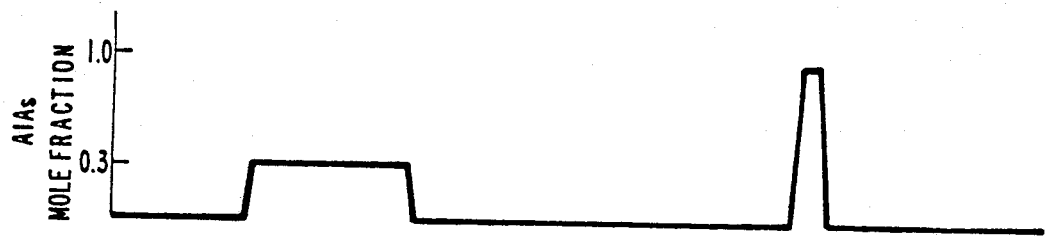
Figure 5C:
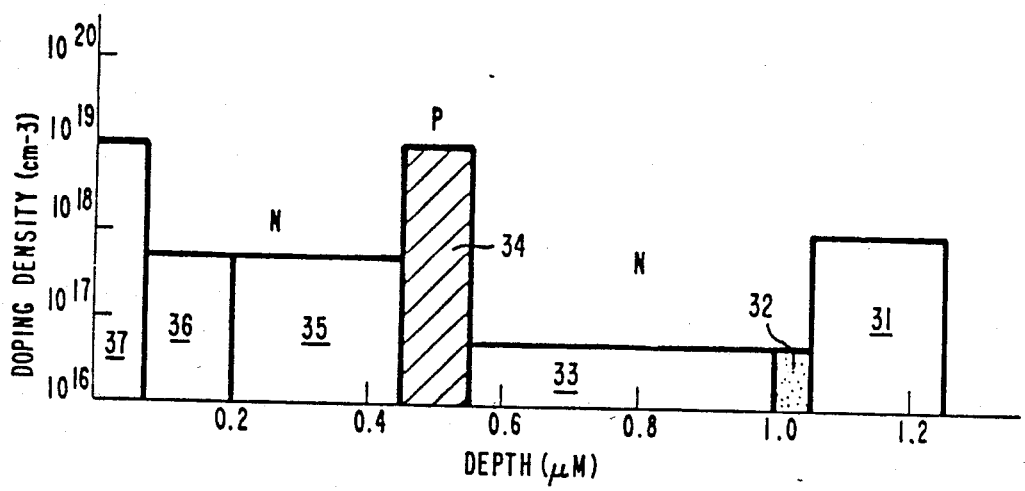

FIG. 5b illustrates the profile of the mole fraction of AlAs for each layer FIG. 5a. FIG. 5c illustrates the profile of the doping density for each layer in FIG. 5a.

Figure 5D:
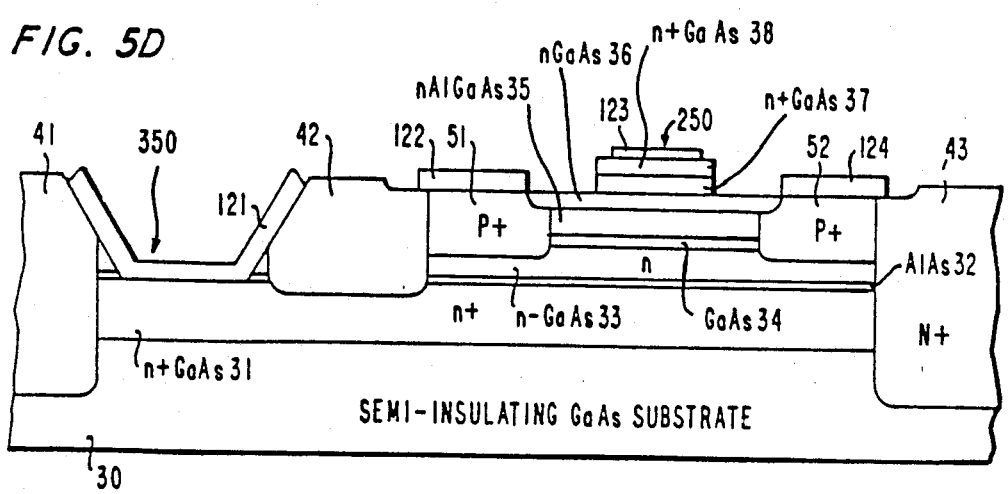
FIG. 5d is a cross-sectional view of a novel heterojunction bipolar transistor formed from the structure of FIG. 5a in accordance with a method of the present invention.

The structure illustrated in FIG. 5d is formed from the structure of FIG. 5a in accordance with the following steps:

Isolation regions 41, 42 and 43 are formed by ion implantation damage with protons or oxygen impurities in accordance with principles well known in the art. A mesa 250 is formed by photolithographic definition and etching in accordance with well-known practice. P-type heavily doped base contact regions 51 and 52 of FIG. 5d are formed by ion implantation in layers 33, 34, 35 and 36.

An opening 350 exposing the collector contact layer 31 to provide electrical contact thereto is formed as illustrated in FIG. 5d by first etching down through layers 38, 37, 36, 35, 34 and 33 with an etchant which attacks all of these layers but does not etch the AlAs layer 32. An example of such an etchant is a solution of $H_2O$ and $NH_4OH$ having a PH of 7. Thereafter, a second etchant, for example, a buffered oxide etch, is applied to etch the AlAs layer 32 and expose the GaAs collector contact layer 31. Thereafter, a metal layer 121 is deposited over the exposed portion of the collector contact layer 31 in the opening 350 to form an ohmic contact in accordance with well known techniques. Also, electrical contact to the base layer 34 is provided by depositing ohmic metal contacts 122 and 124 on the exposed base contact regions 51 and 52 respectively as illustrated in FIG. 5d.

Finally, ohmic contact to the emitter is formed by depositing a metal layer 123 on top of the mesa 250.

OTHER SEMICONDUCTOR HETEROSTRUCTURES

It is contemplated that the invention is useful with other heterostructures besides the GaAs/AlGaAs heterostructure discussed herein. Generally, in an HEMT for example, the structure and process of the invention requires first and second semiconductor layers defining a heterojunction between them, each of the two layers comprising a different semiconductor having a different energy band gap. A two-dimensional electron gas adjacent the heterojunction resides in the layer having the narrower band gap. Further, a stop etch layer comprising a semiconductor overlies the first two layers and has a wider band gap than the one layer containing the two dimensional electron gas.

Many semiconductor heterojunction structures are known besides the GaAs/AlGaAs structure described previously herein. Also, many etchants are known besides the etchants described. Assuming other elements from Groups II through VI are used, it is contemplated that etchants other than those described herein may be employed by the skilled worker in accordance with the present invention.

What is claimed is:

1. A method for fabricating a high electron mobility transistor, comprising:
    forming a crystal layer of undoped gallium arsenide;
    growing an epitaxial layer of doped aluminum gallium arsenide over said gallium arsenide layer;
    terminating said foregoing aluminum gallium arsenide growing step after said aluminum gallium arsenide layer has reached a predetermined optimum thickness;
    growing an epitaxial stop etch layer of aluminum arsenide over said doped aluminum gallium arsenide layer;
    forming at least one overlying material layer over said stop etch layer;
    etching a gate opening through said at least one overlying layer with an etchant which does not attack said stop etch layer; and
    depositing a gate electrode in said gate opening.

2. The method of claim 1 wherein said aluminum gallium arsenide growing step is immediately preceded by the step of:
    growing an undoped buffer layer of aluminum gallium arsenide over said gallium arsenide layer.

3. The method of claim 1 further comprising the step of removing said stop etch layer of aluminum arsenide from the vicinity of said gate opening after said step of forming said gate opening, and before said gate electrode forming step.

4. The method of claim 1 wherein said stop etch layer of aluminum arsenide remains in said gate opening after the formation thereof so that said gate electrode is deposited directly on said stop etch layer.

5. The method of claim 1 further comprising the step of forming source and drain contacts on either side of said gate electrode.

6. A method for fabricating a high electron mobility transistor, comprising:
    forming a crystal layer of a first semiconductor;
    growing an epitaxial layer of a second semiconductor over said first layer;
    terminating said foregoing growing step after said second semiconductor layer has reached a predetermined optimum thickness;
    growing an epitaxial stop etch layer of AlAs over said second semiconductor layer;
    forming at least one overlying material layer over said stop etch layer;
    etching a gate opening through said at least one overlying layer with an etchant which does not attack said stop etch layer; and
    depositing a gate electrode in said gate opening.

7. The method of claim 1 wherein said second semiconductor layer growing step is immediately preceded by the step of:
    growing an undoped buffer layer of said second semiconductor over said first layer;

8. The method of claim 7 further comprising the step of removing said stop etch layer of aluminum arsenide from the vicinity of said gate opening after said step of forming said gate opening, and before said gate electrode forming step.

9. The method of claim 1 wherein said stop etch layer of aluminum arsenide remains in said gate opening after the formation thereof so that said gate electrode is deposited directly on said stop etch layer.

10. The method of claim 1 wherein said stop etch layer growing step comprises growing a layer of a third semiconductor.

11. The method of claim 1 further comprising the step of forming source and drain contacts on either side of said gate electrode.

12. A method for fabricating a transistor on a semiconductor substrate, comprising the steps of:
 forming a first semiconductor layer on the substrate;
 forming a second semiconductor layer of desired critical thickness on the first semiconductor layer, wherein the thickness of the second layer must be not be allowed to vary during the remaining method steps;
 forming a stop-etch layer of aluminum arsenide over the second semiconductor layer;
 forming additional semiconductor layers over the stop-etch layer;
 etching an opening through the additional semiconductor layers to the stop-etch layer, which prevents unwanted etching of the critical second semiconductor layer; and
 forming an electrical contact in the opening.

13. A method as defined in claim 12, and further including the step of:
 removing the stop-etch layer of aluminum arsenide in the region of the opening, before the step of forming an electrical contact.

14. A method for fabricating a high electron mobility transistor, comprising:
 forming a crystal layer of undoped gallium arsenide;
 growing an epitaxial layer of doped aluminum gallium arsenide over said gallium arsenide layer;
 terminating said foregoing aluminum gallium arsenide growing step after said aluminum gallium arsenide layer has reached a predetermined optimum thickness;
 growing an epitaxial stop etch layer over said doped aluminum gallium arsenide layer;
 forming at least one overlying material layer over said stop etch layer;
 etching a gate opening through said at least one overlying layer with an etchant which does not attack said stop etch layer; and
 depositing a gate electrode in said gate opening;
 wherein said stop etch layer remains in said gate opening after the formation thereof so that said gate electrode is deposited directly on said stop etch layer.

15. A method for fabricating a transistor on a semiconductor substrate, comprising the steps of:
 forming a first semiconductor layer on the substrate;
 forming a second semiconductor layer of desired critical thickness on the first semiconductor layer, wherein the thickness of the second layer must not be allowed to vary during the remaining method steps;
 forming a stop-etch layer over the second semiconductor layer;
 forming at least one additional semiconductor layer over the stop-etch layer;
 etching an opening through the at least one additional semiconductor layer to the stop-etch layer, which prevents unwanted etching of the critical second semiconductor layer; and
 forming an electrical contact in the opening;
 wherein the stop-etch layer remains in the opening after the formation thereof so that the electrical contact is deposited directly on the stop-etch layer.

16. A method for fabricating a high electron mobility transistor, comprising:
 forming a crystal layer of a first semiconductor;
 growing an epitaxial layer of a second semiconductor over said first layer;
 terminating said foregoing growing step after said second semiconductor layer has reached a predetermined optimum thickness;
 growing an epitaxial stop etch layer over said second semiconductor layer;
 forming at least one overlying material layer over said stop etch layer;
 etching a gate opening through said at least one overlying layers with an etchant which does not attack said stop etch layer; and
 depositing a gate electrode in said gate opening;
 wherein said stop etch layer remains in said gate opening after the formation thereof so that said gate electrode is deposited directly on said stop etch layer.

* * * * *